United States Patent
Crevenat

(10) Patent No.: US 10,965,121 B2
(45) Date of Patent: Mar. 30, 2021

(54) INTEGRATED THERMALLY PROTECTED VARISTOR AND DISCHARGE TUBE

(71) Applicant: CITEL, Sevres (FR)

(72) Inventor: Vincent Crevenat, Pembroke Pines, FL (US)

(73) Assignee: CITEL, Sevres (FR)

( * ) Notice: Subject to any disclaimer, the term of this patent is extended or adjusted under 35 U.S.C. 154(b) by 622 days.

(21) Appl. No.: 15/728,951

(22) Filed: Oct. 10, 2017

(65) Prior Publication Data
US 2018/0102640 A1    Apr. 12, 2018

(30) Foreign Application Priority Data
Oct. 10, 2016 (FR) ...................................... 1659757

(51) Int. Cl.
| | |
|---|---|
| *H01H 83/10* | (2006.01) |
| *H02H 9/04* | (2006.01) |
| *H02H 9/06* | (2006.01) |
| *H01L 23/34* | (2006.01) |
| *H01H 85/02* | (2006.01) |
| *H02H 9/02* | (2006.01) |
| *H02H 9/00* | (2006.01) |

(52) U.S. Cl.
CPC ............ *H02H 9/042* (2013.01); *H01H 83/10* (2013.01); *H01H 85/0241* (2013.01); *H01L 23/34* (2013.01); *H02H 9/02* (2013.01); *H02H 9/041* (2013.01); *H02H 9/06* (2013.01); *H02H 9/005* (2013.01); *H02H 9/043* (2013.01)

(58) Field of Classification Search
USPC .................................................. 361/117–119
See application file for complete search history.

(56) References Cited

U.S. PATENT DOCUMENTS

| | | | |
|---|---|---|---|
| 6,606,232 B1 * | 8/2003 | Vo .......................... | H01C 7/126 361/118 |
| 6,765,777 B2 | 7/2004 | Cantagrel | |
| 10,629,399 B2 * | 4/2020 | Li .......................... | H01C 7/126 |
| 2014/0092514 A1 * | 4/2014 | Chen ....................... | H01C 7/12 361/118 |
| 2018/0049291 A1 * | 2/2018 | Xu ......................... | H05B 47/11 |

FOREIGN PATENT DOCUMENTS

| | | |
|---|---|---|
| CN | 203166496 U | 8/2013 |
| CN | 103346547 A | 10/2013 |
| DE | 3834514 A1 | 4/1990 |
| EP | 1187290 A1 | 3/2002 |
| WO | WO2013097590 A1 | 7/2013 |

\* cited by examiner

*Primary Examiner* — Danny Nguyen
(74) *Attorney, Agent, or Firm* — Berenato & White, LLC

(57) ABSTRACT

An integrated component for protecting against temporary power surges comprises a first conductive lead and a second conductive lead, each of which mounted on an electrical circuit; a gas discharge tube; a thermally protected varistor and a thermal fuse. The thermally protected varistor comprises a varistor body, a first varistor electrode and a second varistor electrode that are positioned on either side of the varistor body. The varistor body rises in temperature when the voltage imposed between the first and the second varistor electrodes exceeds a voltage threshold. An electrical connection is made via the thermal fuse.

14 Claims, 1 Drawing Sheet

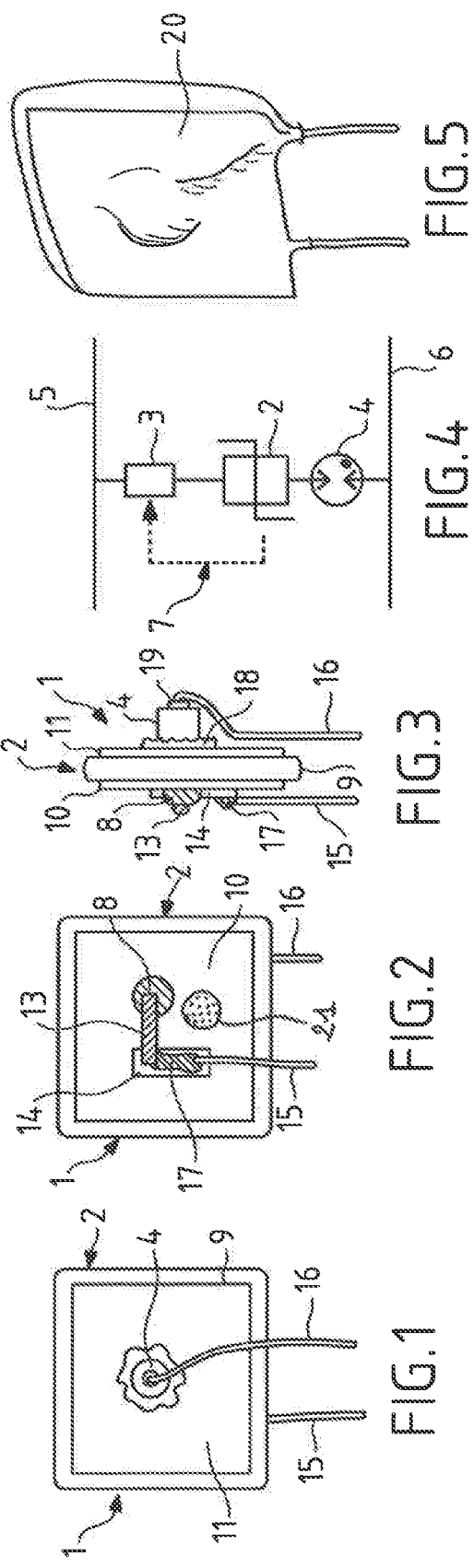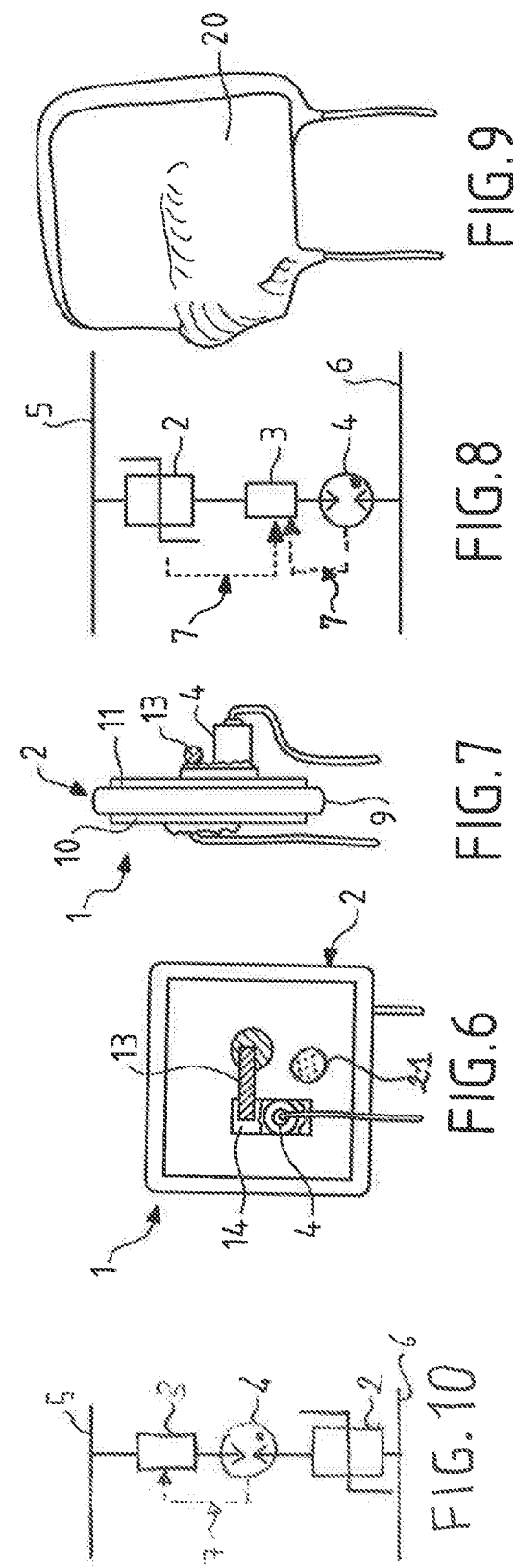

INTEGRATED THERMALLY PROTECTED VARISTOR AND DISCHARGE TUBE

CROSS-REFERENCE TO RELATED APPLICATIONS AND CLAIM TO PRIORITY

This application is related to French Patent Application No. 1659757 filed Oct. 10, 2016, the entire disclosure of which is incorporated herein by reference and to which priority is claimed.

FIELD OF THE INVENTION

The invention relates to the field of integrated surge protection components for electrical devices.

BACKGROUND OF THE INVENTION

In order to protect an electrical device, it is common practice to use, between two lines of an AC, a metal oxide varistor, in particular a zinc oxide varistor, mounted in series with a thermal fuse and a gas discharge tube.

Such a device theoretically operates in the following manner: the gas discharge tube withstands practically all the voltage of the AC. Specifically, the stray capacitance of the gas discharge tube is a few picofarads, while the stray capacitance of the varistor is a few nanofarads. When a surcharge occurs, the gas discharge tube is triggered, which can only be extinguished when the current, known as secondary current, that is passing through it diminishes sufficiently. It is the resistance of the varistor that ensures that the secondary current is limited and enables the gas discharge tube to be extinguished.

When a surcharge protection device has operated a certain number of times, its components reach the end of their service lives. For a varistor, end of service life is manifested by an explosion unless it is disconnected.

If the gas discharge tube reaches the end of its service life first, it will short-circuit, which is manifested by low impedance. As a result, the varistor will increase in temperature sufficient to trigger the thermal fuse. In other words, the circuit becomes disconnected and the surge protector is put out of service.

If the varistor reaches the end of its service life first, the gas discharge tube still enables a current to flow through the varistor. The varistor will then also increase in temperature, causing thermal disconnection.

The gas discharge tube may also suffer a temperature increase, resulting in thermal disconnection.

However, surge protectors for varistors and gas discharge tubes are large and bulky.

SUMMARY OF THE INVENTION

An object of the invention is to combine three following functions: varistor, thermal protection and discharge tube, to form a single integrated discrete component that is able to protect an electrical device.

There are many devices that can be protected by the integrated component of the invention. For example, electronic devices, telephone and IT systems, photovoltaic devices, LED lighting, and others as would be known to one of skill in the art.

Another object of the invention is to facilitate the installation of these three functions on an electronic board associated with a device to be protected against temporary power surges.

Another object of the invention is to enable uniform temperature increases in the integrated component in order to improve the reliability of the thermal disconnection.

According to one embodiment, the invention provides an integrated component for protecting against temporary power surges, comprising:
a first conductive lead and a second conductive lead, each of which may be mounted on an electrical circuit;
a discharge tube comprising a first discharge tube electrode, a second discharge tube electrode and a discharge tube body arranged between the first and the second discharge tube electrodes, wherein the body of the discharge tube is able to increase in temperature when an electric current flows through it;
a thermal fuse comprising a temperature-sensitive element designed to provide an electrical connection in an initial state and to interrupt said electrical connection when it is subjected to a temperature greater than a threshold; and
a varistor comprising:
a varistor body, and
a first varistor electrode and a second varistor electrode that are positioned on either side of the varistor body, wherein the varistor body is able to rise in temperature when the voltage applied across the first and the second varistor electrodes exceeds a voltage threshold,
wherein
the first conductive lead is connected to the first varistor electrode by a first connection,
the second varistor electrode is connected to the first discharge tube electrode by a second connection,
the second discharge tube electrode is connected to the second conductive lead by a third connection, and
at least one of the first, second or third connections is made through the thermal fuse, and the temperature-sensitive element is sensitive to a temperature increase of at least one of the discharge tube and the varistor.

According to another embodiment, the second connection is made with a heat-fusible solder forming the thermal fuse.

According to another embodiment, the thermal fuse is disposed between the varistor and the discharge tube. Alternatively, the electrode of the discharge tube is soldered directly to an electrode of the varistor.

According to other embodiments, such an integrated component comprises one or more of the following features:

In one embodiment, the temperature-sensitive element of the thermal fuse is a metal connector having a melting point equal to or less than a thermal safety temperature threshold for the varistor or the discharge tube, the metal connector being soldered by a solder joint to at least one of the first discharge tube electrode, the second discharge tube electrode, the first varistor electrode and the second varistor electrode, so as to form one of the first, second or third connections.

In one embodiment, a first end of the metal connector is soldered to the first varistor electrode, the component furthermore comprising an insulator arranged on a surface of the first varistor electrode in such a way that a second end of the metal connector does not make contact with the surface of the first varistor electrode.

In one embodiment, the insulator is a plate made of glass, ceramic or plastic.

There are many types of plate suitable for use with the invention. In one embodiment, the plate is pierced by a through-hole and the second end of the metal connector is soldered by a solder joint to the first varistor electrode through the hole. In one embodiment, the plate has a groove such that the molten metal of the connector flows into the groove to ensure a reliable electrical disconnection.

In one embodiment, a first surface of the plate is fastened to the surface of the first varistor electrode, the first end of the metal connector rests on a second surface of the plate, and the second end of the metal connector protrudes beyond the second surface of the plate. In one embodiment, the body and the first end of the metal connector rest on the second surface of the plate, whereas the second end of the metal connector protrudes beyond the second surface of the plate.

In one embodiment, the metal connector is a metal rod having a body and two ends.

In one embodiment, the body of the metal rod is in a heat-shrinkable sleeve, such that when the temperature increases, the end of the metal rod that is soldered to the first varistor electrode is detached by the force exerted by the heat-shrinkable sleeve on the body of the metal rod.

In one embodiment, the metal connector melts when the temperature increases above the melting point of the metal connector; and a portion of the first varistor electrode is covered by a thermoactive material, wherein the thermoactive material melts when the temperature increase below the melting point of the metal connector, and increases the spreading coefficient of the metal connector in the liquid state over the first electrode of the varistor, such that the metal connector transforms into a metal film spreading over the first electrode of the varistor upon a temperature increase above the melting point of the metal connector.

In one embodiment, the thermally protected varistor is covered entirely with the thermoactive material.

According to one embodiment, the heat-fusible material comprises polyamide.

The solder joints made between any pair of elements of the component, which elements are selected from the conductive leads, the discharge tube electrodes or the metal connector, are electrically conductive solder joints.

In one preferred embodiment, the thermal fuse is a heat-fusible solder joint made of metal that is soldered using its own molten material.

In one embodiment, the heat-fusible solder joint is made of a tin-based alloy that may include various other metals, such as bismuth, silver or copper, the melting point being selected by varying the composition of the alloy. In a preferred embodiment, the heat-fusible solder joint is formed of a 'low temperature' tin alloy with a melting point of between about 112° C. and about 130° C., preferably between about 112° C. and about 118° C.

According to one embodiment, the body of the varistor is made of metal oxide.

According to one embodiment, the discharge tube is a gas discharge tube (GDT).

In one embodiment, the component furthermore comprises a coating comprising a protective resin, wherein the coating is arranged around the varistor, the thermal fuse and the discharge tube so as to form an electrically insulating protective barrier, wherein only a portion of each of the two conductive leads protruding beyond the coating.

In one embodiment, the protective resin comprises an epoxy resin.

In one embodiment, the electrical circuit is a printed circuit, also known as 'electronic board'. In one embodiment, the electrical circuit is an electronic circuit, also called 'printed circuit board' (PCB).

According to one embodiment, the varistor is a varistor of circular shape, a varistor of rectangular shape or a varistor of square shape.

By way of example, the varistor is selected from the group comprising a 34×34 mm varistor, a 34×44 mm varistor and a 34×52 mm varistor. The thickness of the varistor depends on the maximum nominal operating voltage. This nominal operating voltage may vary from a few tens of volts to several hundred volts.

According to one embodiment, the varistor comprises a zinc oxide (ZnO) varistor.

According to one embodiment, the invention also provides an electrical system comprising an electronic board and a protective integrated component such as described above, the electronic board having two electrical tracks connected electrically to one another by way of the integrated component.

The invention also provides a method of manufacturing an integrated component for protecting an electrical line against temporary power surges, comprising the steps of:
  providing a first conductive lead and a second conductive lead, each of which may be mounted on an electrical circuit,
  providing a gas discharge tube comprising a first discharge tube electrode, a second discharge tube electrode and a discharge tube body arranged between the first and the second discharge tube electrodes, wherein the body of the discharge tube is able to rise in temperature when an electric current flows through it,
  providing a thermal fuse equipped with a temperature-sensitive element designed to provide an electrical connection in an initial state and to interrupt said electrical connection when it is subjected to a temperature greater than a threshold,
  providing a varistor comprising:
    a varistor body, and
    a first varistor electrode and a second varistor electrode that are positioned on either side of the varistor body, wherein the varistor body is able to rise in temperature when the voltage applied across the first and the second varistor electrodes exceeds a voltage threshold,
  making a first electrical connection between the first conductive lead and the first varistor electrode,
  making a second electrical connection between the first discharge tube electrode and the second varistor electrode, and
  making a third electrical connection between the second discharge tube electrode and the second conductive lead,
wherein one of the first, second and third electrical connections is made via the thermal fuse.

BRIEF DESCRIPTION OF THE DRAWINGS

The invention will be better understood and other aims, details, features and advantages thereof will become more clearly apparent over the course of the following description of several particular embodiments of the invention, which are given solely by way of non-limiting illustration, with reference to the appended drawings.

In the drawings:
FIG. 1 is a front view of a component according to a first embodiment, when it is not coated.
FIG. 2 is a rear view of the component of FIG. 1.
FIG. 3 is a side view of the component of FIG. 1.
FIG. 4 is a circuit diagram of the component of FIG. 1.
FIG. 5 is a perspective view of the component of FIG. 1, when it is coated.

FIG. 6 is a front view of a component according to a second embodiment, when it is not coated.

FIG. 7 is a side view of the component of FIG. 6.

FIG. 8 is a circuit diagram of the component of FIG. 6.

FIG. 9 is a perspective view of the component of FIG. 6, when it is coated.

FIG. 10 is a circuit diagram of a third embodiment.

DETAILED DESCRIPTION OF THE PREFERRED EMBODIMENT(S)

A discrete component for mounting on a printed electrical circuit and to protect an electrical device against power surges will now be described with reference to the accompanying figures.

Three alternative embodiments of such a discrete component will be described. The first embodiment is described with reference to FIGS. 1 to 5. The second embodiment is described with reference to FIGS. 6 to 9. The third embodiment is described with reference to FIG. 10. Identical or similar elements have been referenced with the same reference numbers in the figures showing the two embodiments.

FIG. 4 shows a circuit diagram for component 1 as shown in FIG. 1 according to the first embodiment. The circuit comprises a discharge tube 4, a varistor 2 and a thermal fuse 3 mounted in series between two electrical lines 5 and 6 of a circuit or electrical device to be protected. The electrical lines 5 and 6 may be any conductor used to supply electrical power at a low or medium voltage to an electrical device. The thermal fuse 3 is connected to the electrical line 5 and to the varistor 2. A thermal bridge 7 makes it possible to spread the heat emitted by the varistor 2 to the thermal fuse 3.

The discharge tube 4 is connected to the varistor 2 and to the electrical line 6 to be protected.

The discrete component 1 comprises the following three functions: a discharge tube 4, a varistor 2 and a thermal fuse 3. The component and a method for manufacturing the component according to the first embodiment, will be described with reference to FIGS. 1, 2, 3 and 5.

The discrete component 1 comprises a varistor 2, for example a varistor of rectangular shape, comprising a rectangular zinc oxide wafer 9 and two electrodes 10 and 11, which are also rectangular and positioned on either side of the zinc oxide wafer 9.

The component also comprises a gas discharge tube 4 having two electrodes. The gas discharge tube 4 is preferably small. For example a BB series 2-electrode gas discharge tube, a BH series 2-electrode gas discharge tube, or a BG series gas-filled spark gap gas discharge tube such as the BG600, available from CITEL at http://www.citel.fr/en/produit/citel-gas-discharge-tubes-range.html may be used for the invention.

The component 1 also comprises an insulating wafer 14, for example made of plastic, having dimensions considerably smaller than the dimensions of the electrode 10, for example a tenth of the rectangular area of the electrode 10.

The component 1 also comprises a heat-fusible electrically conductive bar 13, preferably made of metal, for example of tin.

The component 1 also comprises two electrical tabs 15 and 16.

The manufacture of such a component 1 is susceptible to mass production.

The manufacture of such a component 1 comprises in particular the step of soldering one of the ends of the heat-fusible bar 13 to the electrode 10 via a solder joint 8 formed with the material of the heat-fusible bar 13.

One face of the insulating wafer 14 is then positioned on the electrode 10. A step of bonding the face of the insulating wafer 14 to the electrode 10 may optionally be provided.

The manufacturing also comprises a step of fastening the other end of the heat-fusible bar 13 to the other face of the insulating wafer 14, such that the heat-fusible bar is in electrical contact with the varistor only via the end soldered to the electrode 10.

The manufacturing further comprises a step of soldering joint 18 between a first discharge tube electrode and the electrode 11, and another of soldering joint 17 between tab 15 and the end of the heat-fusible bar 13 placed on the insulating wafer 14.

A further step comprises soldering joint 19 between tab 16 and a second discharge tube electrode.

The manufacture of the component then comprises a step of providing a thermoactive material 21 in an area of the surface of the electrode 10.

The thermoactive material 21 is heat-fusible and has aggressive chemical properties, such that it cleans and purifies impurities from the surface onto which it melts.

The thermoactive material is for example a material selected from the following materials:

A no clean (NC) flux, composed of resin, solvent and a small amount of activator. A flux of this type is not conductive.

A water soluble (WS) flux, composed of organic acids, thixotropes and solvents.

A rosin mildly activated (RMA) flux, composed of resin, solvent and a small amount of activator. A flux of this type is not conductive.

A rosin activated (RA) flux, composed of resin, solvent and aggressive activators.

Finally, in order to protect the component 1 thus obtained, it is advantageous to cover the varistor 2, the discharge tube 4 and the heat-fusible bar 13 with a resin coating 20 (see FIG. 5), such that only one end of each of the tabs 15, 16 intended to be mounted on a printed circuit, protrude beyond the coating 20.

The operation of such a component during a temporary power surge, for example caused by lightning, between the lines 5 and 6 will be described. The power surge triggers the discharge tube 4. Specifically, the discharge tube 4 changes from a very high impedance state to a quasi-short circuit upon the application of a voltage greater than a voltage threshold across the electrical line 5 and the electrical line 6.

Moreover, this power surge induces a current that flows through the varistor. The current flowing through the varistor 2 then induces gradual heating of the varistor 2 and therefore heating of the thermal fuse 3 by way of the thermal bridge 7 between the varistor and the thermal fuse 3. When the power surge exceeds the nominal voltage threshold of the varistor 2, the varistor 2 changes to low impedance and limits the voltage across its terminals. The discrete component is therefore readily able to protect the electrical line 5 from the applied power surge.

However, beyond a heating threshold corresponding to a disconnection temperature of the thermal fuse 3, the induced current is abruptly interrupted by the thermal fuse 3.

The thermal fuse 3 comprises the heat-fusible bar 13 and also the thermoactive material 21.

The disconnection enabled by the heat-fusible bar 13 and the thermoactive material 21 will now be described in more detail.

The heating induced on the thermoactive material 21 results in the material melting and flowing onto the surface of the first electrode 10, so as to clean and purify the surface of the first electrode 10.

The heating induced on the heat-fusible bar 13 by the thermal bridge 7 will also cause the heat-fusible bar 13 to melt, subsequent to the melting of the thermoactive material 21, the melting point of which is lower. The molten material of the bar then forms a drop that slides and spreads over the surface of the first electrode 10. Specifically, the cleaning produced by the molten thermoactive material 21 on the surface of the first varistor electrode 10 causes the wettability of tin on the surface of the first varistor electrode 10 to increase. As a result, the molten tin of the heat-fusible bar 13 forms a thin metal film over the entire surface of the first varistor electrode 10. This thin film is not able to provide the electrical connection between the first varistor electrode and the first conductive lead 15.

The magnitude of the current therefore becomes zero.

The component 1 is thus able to protect the electrical line 5 from fires by completely disconnecting it upon a temperature increase beyond a temperature threshold.

With reference to FIGS. 6 to 9, a second embodiment of the discrete component 1 according to the invention will be disclosed. Elements like or similar to those of the figures of the first embodiment have been identified by the same reference numbers.

FIG. 8 shows an equivalent circuit diagram of the component 1 of FIG. 6 according to the second embodiment. As in the first embodiment, the circuit comprises a discharge tube 4, a varistor 2 and a thermal fuse 3 mounted in series on an electrical line to be protected. In contrast to the first embodiment, the thermal fuse 3 is arranged between the varistor 2 and the discharge tube 4.

The varistor 2 is connected to the electrical line 5 to be protected and to the thermal fuse 3. A thermal bridge 7 makes it possible to diffuse the heat emitted by the varistor 2 and the discharge tube 4 to the thermal fuse 3. The discharge tube 4 is connected to the thermal fuse 3 and to a second electrical line 6 to be protected.

A method for manufacturing the discrete component according to the second embodiment, incorporating the three following functions: discharge tube 4, varistor 2 and thermal fuse 3, will be described with reference to FIGS. 6 to 9. The discrete component 1 according to this second embodiment comprises the same elements as the component according to the first embodiment. Only the manufacturing method differs for some steps.

The manufacture of the component 1 comprises in particular the step of soldering one of the ends of the heat-fusible bar 13 to the electrode 11 via a solder joint 8.

In this second embodiment, one face of the insulating wafer 14 is placed on the electrode 11, and not on the electrode 10. Advantageously, this face of the insulating wafer 14 is able to be bonded to the electrode 11.

In addition, it is necessary to fasten the other end of the heat-fusible bar 13 to the other face of the insulating wafer 14, such that the heat-fusible bar is in electrical contact with the varistor only through its end soldered to the electrode 11, and not to the electrode 10.

It is also necessary to produce a solder joint 18 between a first discharge tube electrode and the end of the heat-fusible bar 13 placed on the insulating wafer 14.

The electrical tabs are also soldered differently than in the first embodiment. Specifically, the manufacturing comprises producing a solder joint 17 between the tab 15 and the electrode 10, and producing a solder joint 19 between the tab 16 and a second discharge tube electrode.

A third embodiment is shown in FIG. 10. FIG. 10 shows a circuit diagram for the component 1 according to the third embodiment. As in the first embodiment, the circuit comprises a discharge tube 4, a varistor 2 and a thermal fuse 3 mounted in series on an electrical line to be protected. In contrast to the first embodiment, the discharge tube 4 is arranged between the thermal fuse 3 and the varistor 2. In such an embodiment, the thermal fuse 3 is thus sensitive only to heating by the discharge tube 4 by way of bridge 7.

Although the invention has been described in connection with several particular embodiments, it is readily obvious that it is in no way limited thereto, and that it comprises all of the technical equivalents of the means described, and also combinations thereof if these fall within the scope of the invention. For example, it is possible to provide other varistors for manufacturing the component. For example, the varistor used may have technical features different from those outlined above, for example dimensions of about 34×34 mm in width and in length, a maximum nominal operating voltage of about 385 volts AC and about 505 volts DC, a DC voltage at a current of 1 mA of between about 590 and 600 volts, and a maximum discharge current of 40 kA (8/20 µs).

The use of the verb 'have', 'comprise' or 'include', and of its conjugated forms, does not exclude elements or steps other than those mentioned in a claim from being present. The use of the indefinite article 'a' or 'an' for an element or a step does not exclude a plurality of such elements or steps from being present, unless indicated otherwise.

In the claims, any reference sign between parentheses should not be interpreted as a limitation of the claim.

The invention claimed is:

1. An integrated component for protecting against temporary power surges, comprising:
   a first conductive lead and a second conductive lead, each conductive lead mounted to an electrical circuit;
   a gas discharge tube comprising a first discharge tube electrode, a second discharge tube electrode and a discharge tube body arranged between the first and the second discharge tube electrodes, wherein the body of the discharge tube rises in temperature when an electric current flows through it;
   a thermal fuse comprising with a temperature-sensitive element to provide an electrical connection in an initial state and to interrupt said electrical connection when subjected to a temperature greater than a temperature threshold; and
   a varistor comprising:
      a varistor body, and
      a first varistor electrode and a second varistor electrode positioned on either side of the varistor body, wherein the varistor body rises in temperature when the voltage applied across the first and the second varistor electrodes exceeds a voltage threshold;
   wherein
      the first conductive lead is connected to the first varistor electrode by a first connection,
      the second varistor electrode is connected to the first discharge tube electrode by a second connection,
      the second discharge tube electrode being connected to the second conductive lead by a third connection, and
      the first connection is made through the thermal fuse, wherein the temperature-sensitive element is sensitive to a temperature increase of at least one of the discharge tube and the varistor, wherein the temperature-sensitive element of the thermal fuse is a metal connector having a melting point equal to or less than a thermal safety temperature threshold for the varistor, wherein a first end of the metal connector is soldered to the first varistor electrode, the component furthermore comprising an insulator arranged on a surface of the first varistor electrode such that a second end of the metal connector does not make contact with the surface of the first varistor electrode.

2. The integrated component according to claim 1, wherein the metal connector melts upon a temperature increase above the melting point of the metal connector; and wherein a portion of the first varistor electrode is covered by a thermoactive material, wherein the thermoactive material melts upon a temperature increase below the melting point of the metal connector, and increases the coefficient of spreading of the metal connector in the liquid state over the first electrode of the varistor, such that the metal connector transforms into a metal film spreading over the first electrode of the varistor upon a temperature increase above the melting point of the metal connector.

3. The integrated component according to claim 1, wherein the insulator is a plate made of plastic, ceramic or glass.

4. The integrated component according to claim 2, wherein the insulator is a plate made of plastic, ceramic or glass.

5. The integrated component according to claim 1, furthermore comprising a coating comprising a protective resin, the coating being arranged around the varistor, the thermal fuse and the discharge tube so as to form an electrically insulating protective barrier, wherein only a portion of each of the two conductive leads protruding beyond the coating.

6. The integrated component according to claim 2, furthermore comprising a coating comprising a protective resin, the coating being arranged around the varistor, the thermal fuse and the discharge tube so as to form an electrically insulating protective barrier, wherein only a portion of each of the two conductive leads protruding beyond the coating.

7. The integrated component according to claim 3, furthermore comprising a coating comprising a protective resin, the coating being arranged around the varistor, the thermal fuse and the discharge tube so as to form an electrically insulating protective barrier, wherein only a portion of each of the two conductive leads protruding beyond the coating.

8. The integrated component according to claim 5, wherein the protective resin comprises an epoxy resin.

9. A method for manufacturing an integrated component for protecting against temporary power surges, comprising:
providing a first and a second conductive lead for mounting on an electrical circuit;
providing a gas discharge tube comprising a first discharge tube electrode, a second discharge tube electrode and a discharge tube body arranged between the first and the second discharge tube electrodes, wherein the body of the discharge tube rises in temperature when an electric current flows through it;
providing a thermal fuse equipped with a temperature-sensitive element designed to provide an electrical connection in an initial state and to interrupt said electrical connection when it is subjected to a temperature greater than a threshold;
providing a varistor comprising:
a varistor body, and
a first varistor electrode and a second varistor electrode that are positioned on either side of the varistor body, the varistor body being able to rise in temperature when the voltage applied across the first and the second varistor electrodes exceeds a voltage threshold;
making a first electrical connection between the first conductive lead and the first varistor electrode,
making a second electrical connection between the first discharge tube electrode and the second varistor electrode, and
making a third electrical connection between the second discharge tube electrode and the second conductive lead,
wherein the first electrical connection is made via the thermal fuse, wherein the temperature-sensitive element of the thermal fuse is a metal connector having a melting point equal to or less than a thermal safety temperature threshold for the varistor,
soldering a first end of the metal connector to the first varistor electrode, and
arranging an insulator on a surface of the first varistor electrode such that a second end of the metal connector does not make contact with the surface of the first varistor electrode.

10. An integrated component for protecting against temporary power surges, comprising:
a first conductive lead and a second conductive lead, each conductive lead mounted to an electrical circuit;
a gas discharge tube comprising a first discharge tube electrode, a second discharge tube electrode and a discharge tube body arranged between the first and the second discharge tube electrodes, wherein the body of the discharge tube rises in temperature when an electric current flows through it;
a thermal fuse comprising with a temperature-sensitive element to provide an electrical connection in an initial state and to interrupt said electrical connection when subjected to a temperature greater than a temperature threshold; and
a varistor comprising:
a varistor body, and
a first varistor electrode and a second varistor electrode positioned on either side of the varistor body, wherein the varistor body rises in temperature when the voltage applied across the first and the second varistor electrodes exceeds a voltage threshold;
wherein
the first conductive lead is connected to the first varistor electrode by a first connection,
the second varistor electrode is connected to the first discharge tube electrode by a second connection,
the second discharge tube electrode being connected to the second conductive lead by a third connection, and
the second connection is made through the thermal fuse, wherein the temperature-sensitive element is sensitive to a temperature increase of at least one of the discharge tube and the varistor,
wherein the temperature-sensitive element of the thermal fuse is a metal connector having a melting point equal to or less than a thermal safety temperature threshold for the varistor, wherein a first end of the metal connector is soldered to the second varistor electrode, the component furthermore comprising an insulator arranged on a surface of the second varistor electrode such that a second end of the metal connector does not make contact with the surface of the second varistor electrode.

11. The integrated component according to claim 10, wherein the metal connector melts upon a temperature increase above the melting point of the metal connector; and wherein a portion of the second varistor electrode is covered by a thermoactive material, wherein the thermoactive material melts upon a temperature increase below the melting point of the metal connector, and increases the coefficient of spreading of the metal connector in the liquid state over the second electrode of the varistor, such that the metal connector transforms into a metal film spreading over the second electrode of the varistor upon a temperature increase above the melting point of the metal connector.

12. The integrated component according to claim 10, furthermore comprising a coating comprising a protective resin, the coating being arranged around the varistor, the thermal fuse and the discharge tube so as to form an electrically insulating protective barrier, wherein only a portion of each of the two conductive leads protruding beyond the coating.

13. The integrated component according to claim 12, wherein the protective resin comprises an epoxy resin.

14. A method for manufacturing an integrated component for protecting against temporary power surges, comprising:
  providing a first and a second conductive lead for mounting on an electrical circuit;
  providing a gas discharge tube comprising a first discharge tube electrode, a second discharge tube electrode and a discharge tube body arranged between the first and the second discharge tube electrodes, wherein the body of the discharge tube rises in temperature when an electric current flows through it;
  providing a thermal fuse equipped with a temperature-sensitive element designed to provide an electrical connection in an initial state and to interrupt said electrical connection when it is subjected to a temperature greater than a threshold;
  providing a varistor comprising:
    a varistor body, and
    a first varistor electrode and a second varistor electrode that are positioned on either side of the varistor body, the varistor body being able to rise in temperature when the voltage applied across the first and the second varistor electrodes exceeds a voltage threshold;
  making a first electrical connection between the first conductive lead and the first varistor electrode,
  making a second electrical connection between the first discharge tube electrode and the second varistor electrode, and
  making a third electrical connection between the second discharge tube electrode and the second conductive lead,
wherein the second electrical connection is made via the thermal fuse, wherein the temperature-sensitive element of the thermal fuse is a metal connector having a melting point equal to or less than a thermal safety temperature threshold for the varistor,
  soldering a first end of the metal connector to the second varistor electrode, and
  arranging an insulator on a surface of the second varistor electrode such that a second end of the metal connector does not make contact with the surface of the second varistor electrode.

\* \* \* \* \*